(12) United States Patent
Horvath et al.

(10) Patent No.: US 6,880,246 B2
(45) Date of Patent: Apr. 19, 2005

(54) METHOD OF FORMING SUBSTRATE WITH FLUID PASSAGE SUPPORTS

(75) Inventors: Janis Horvath, San Diego, CA (US); Mohammad Akhavin, Escondido, CA (US); Joseph E. Scheffelin, Poway, CA (US); Brian J. Keefe, La Jolla, CA (US); David McElfresh, San Diego, CA (US); Pere Esterri, San Diego, CA (US)

(73) Assignee: Hewlett-Packard Development Company, L.P, Houston, TX (US)

( * ) Notice: Subject to any disclaimer, the term of this patent is extended or adjusted under 35 U.S.C. 154(b) by 0 days.

(21) Appl. No.: 10/292,331

(22) Filed: Nov. 12, 2002

(65) Prior Publication Data

US 2003/0231229 A1 Dec. 18, 2003

Related U.S. Application Data (62) Division of application No. 10/175,027, filed on Jun. 18, 2002, now Pat. No. 6,520,624.

(51) Int. Cl.$^7$ .............................. B23P 17/00; B41J 2/155
(52) U.S. Cl. ...................... 29/890.1; 29/25.35; 29/611; 347/42
(58) Field of Search ............................. 29/890.1, 25.35, 29/611; 347/42, 13, 65, 89; 349/40, 42, 43, 63, 65, 12, 13

(56) References Cited

U.S. PATENT DOCUMENTS

| | | | | |
|---|---|---|---|---|
| 4,826,131 A | * | 5/1989 | Mikkor | 251/129.17 |
| 5,155,498 A | * | 10/1992 | Roy et al. | 347/11 |
| 5,308,442 A | * | 5/1994 | Taub et al. | 216/27 |
| 5,317,346 A | | 5/1994 | Garcia | |
| 5,489,930 A | * | 2/1996 | Anderson | 347/71 |
| 5,565,900 A | | 10/1996 | Cowger et al. | |
| 5,608,436 A | * | 3/1997 | Baughman et al. | 347/65 |
| 5,635,966 A | * | 6/1997 | Keefe et al. | 347/43 |
| 5,754,205 A | * | 5/1998 | Miyata et al. | 347/70 |
| 5,922,218 A | * | 7/1999 | Miyata et al. | 216/27 |
| 6,099,109 A | * | 8/2000 | Komuro | 347/50 |
| 6,132,034 A | | 10/2000 | Miller | |
| 6,343,857 B1 | | 2/2002 | Cowger | |

* cited by examiner

*Primary Examiner*—A. Dexter Tugbang
*Assistant Examiner*—Tai Van Nguyen (57) ABSTRACT

A method of forming a fluid ejection assembly includes providing a substrate including a plurality of layers and having a plurality of fluid passages extending through the plurality of layers, extending a support between opposite sides of each of the fluid passages, and mounting a plurality of fluid ejection devices on the substrate, including communicating each of the fluid ejection devices with one of the fluid passages.

21 Claims, 5 Drawing Sheets

METHOD OF FORMING SUBSTRATE WITH FLUID PASSAGE SUPPORTS

CROSS REFERENCE TO RELATED APPLICATION(s)

This is a continuation divisional of copending application number 10/175,027 now U.S. Pat. No. 6,520,624 filed on Jun. 18, 2002 which is hereby incorporated by reference herein.

THE FIELD OF THE INVENTION

The present invention relates generally to fluid ejection devices, and more particularly to fluid passage supports for a substrate of a fluid ejection assembly.

BACKGROUND OF THE INVENTION

A conventional inkjet printing system, as one embodiment of a fluid ejection system, includes a printhead, an ink supply which supplies liquid ink to the printhead, and an electronic controller which controls the printhead. The printhead, as one embodiment of a fluid ejection device, ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

In one arrangement, commonly referred to as a wide-array inkjet printing system, a plurality of individual printheads, also referred to as printhead dies, are mounted on a single substrate. As such, a number of nozzles and, therefore, an overall number of ink drops which can be ejected per second is increased. Since the overall number of drops which can be ejected per second is increased, printing speed can be increased with the wide-array inkjet printing system.

When mounting a plurality of printhead dies on a single substrate, the single substrate performs several functions including fluid and electrical routing as well as printhead die support. More specifically, the single substrate accommodates communication of ink between the ink supply and each of the printhead dies, accommodates communication of electrical signals between the electronic controller and each of the printhead dies, and provides a stable support for each of the printhead dies. As such, the single substrate may have a plurality of fluid passages formed therethrough to accommodate communication of ink between the ink supply and each of the printhead dies. Unfortunately, forming a plurality of fluid passages through the substrate may compromise the integrity and/or strength of the substrate.

Accordingly, it is desired to enhance the integrity and/or strength of a substrate having a plurality of fluid passages formed therethrough.

SUMMARY OF THE INVENTION

A method of forming a fluid ejection assembly includes providing a substrate including a plurality of layers and having a plurality of fluid passages extending through the plurality of layers, extending a support between opposite sides of each of the fluid passages, and mounting a plurality of fluid ejection devices on the substrate, including communicating each of the fluid ejection devices with one of the fluid passages.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and-is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
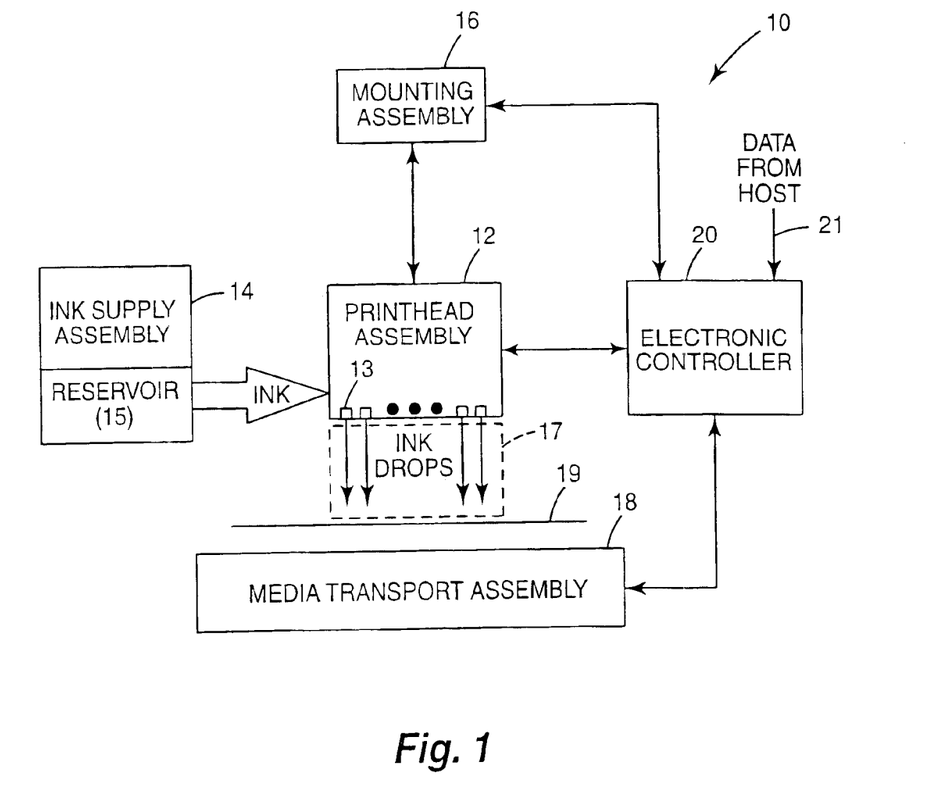
FIG. 1 is a block diagram illustrating one embodiment of an inkjet printing system according to the present invention.

FIG. 1 illustrates one embodiment of an inkjet printing system 10 according to the present invention. Inkjet printing system 10 constitutes one embodiment of a fluid ejection system which includes a fluid ejection assembly, such as an inkjet printhead assembly 12, and a fluid supply assembly, such as an ink supply assembly 14. In the illustrated embodiment, inkjet printing system 10 also includes a mounting assembly 16, a media transport assembly 18, and an electronic controller 20.

Inkjet printhead assembly 12, as one embodiment of a fluid ejection assembly, is formed according to an embodiment of the present invention, and includes one or more printheads or fluid ejection devices which eject drops of ink or fluid through a plurality of orifices or nozzles 13. In one embodiment, the drops are directed toward a medium, such as print medium 19, so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes, in one embodiment, characters, symbols, and/or other graphics or images to be printed upon print medium 19 as inkjet printhead assembly 12 and print medium 19 are moved relative to each other.

Ink supply assembly 14, as one embodiment of a fluid supply assembly, supplies ink to printhead assembly 12 and includes a reservoir 15 for storing ink. As such, in one embodiment, ink flows from reservoir 15 to inkjet printhead assembly 12. In one embodiment, inkjet printhead assembly 12 and ink supply assembly 14 are housed together in an inkjet or fluidjet cartridge or pen. In another embodiment, ink supply assembly 14 is separate from inkjet printhead assembly 12 and supplies ink to inkjet printhead assembly 12 through an interface connection, such as a supply tube.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly and mounting assembly 16 includes a-carriage for moving inkjet printhead assembly 12 relative to media transport assembly 18. In another embodiment, inkjet printhead assembly 12 is a non-scanning type printhead assembly and mounting assembly 16 fixes inkjet printhead assembly 12 at a prescribed position relative to media transport assembly 18.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops, is determined by the print job commands and/or command parameters. In one embodiment, logic and drive circuitry forming a portion of electronic controller 20 is located on inkjet printhead assembly 12. In another embodiment, logic and drive circuitry is located off inkjet printhead assembly 12.

Figure 2:
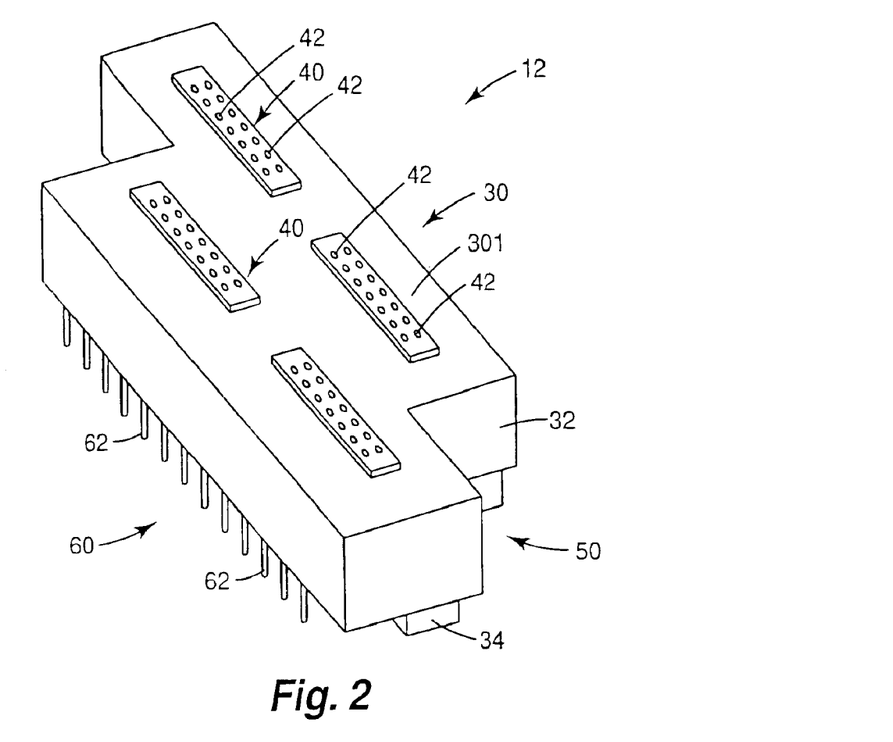
FIG. 2 is a top perspective view illustrating one embodiment of an inkjet printhead assembly according to the present invention.
Figure 3:
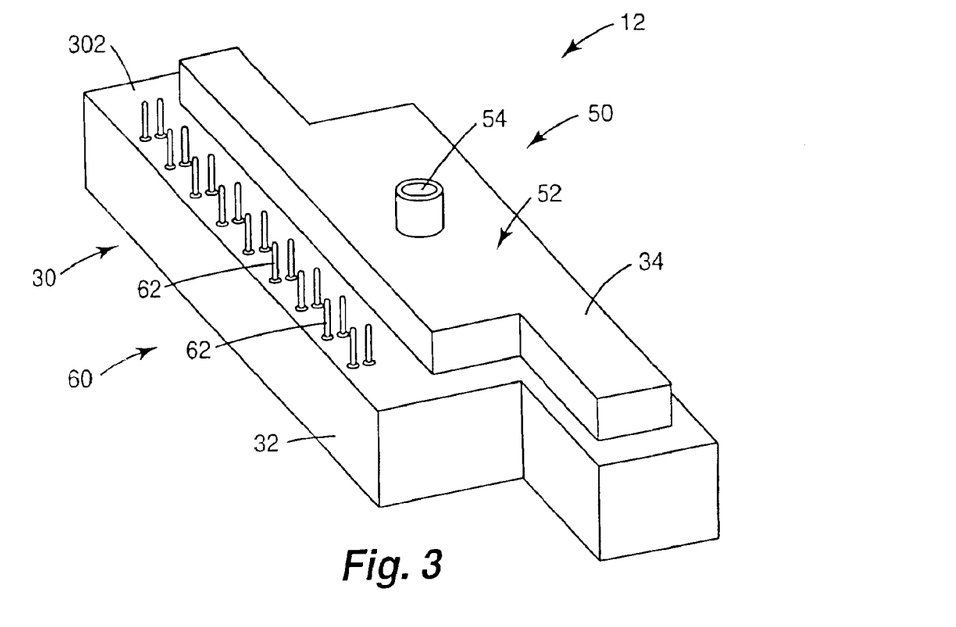
FIG. 3 is a bottom perspective view of the inkjet printhead assembly of FIG. 2.

FIGS. 2 and 3 illustrate one embodiment of a portion of inkjet printhead assembly 12. Inkjet printhead assembly 12 is a wide-array or multi-head printhead assembly and includes a carrier 30, a plurality of printhead dies 40, an ink delivery system 50, and an electronic interface system 60. Carrier 30 has an exposed surface or first face 301 and an exposed surface or second face 302 which is opposite of and oriented substantially parallel with first face 301. Carrier 30 serves to carry or provide mechanical support for printhead dies 40. In addition, carrier 30 accommodates fluidic communication between printhead dies 40 and ink supply assembly 14 via ink delivery system 50 and accommodates electrical communication between printhead dies 40 and electronic controller 20 via electronic interface system 60.

Printhead dies 40 are mounted on first face 301 of carrier 30 and aligned in one or more rows. In one embodiment, printhead dies 40 are spaced apart and staggered such that printhead dies 40 in one row overlap at least one printhead die 40 in another row. Thus, inkjet printhead assembly 12 may span a nominal page width or a width shorter or longer than nominal page width. In one embodiment, a plurality of inkjet printhead assemblies 12 are mounted in an end-to-end manner. Carrier 30, therefore, has a staggered or stair-step profile. Thus, at least one printhead die 40 of one inkjet printhead assembly 12 overlaps at least one printhead die 40 of an adjacent inkjet printhead assembly 12. While four printhead dies 40 are illustrated as being mounted on carrier 30, the number of printhead dies 40 mounted on carrier 30 may vary.

Ink delivery system 50 fluidically couples ink supply assembly 14 with printhead dies 40. In one embodiment, ink delivery system 50 includes a manifold 52 and a port 54. Manifold 52 is formed in carrier 30 and distributes ink through carrier 30 to each printhead die 40. Port 54 communicates with manifold 52 and provides an inlet for ink supplied by ink supply assembly 14.

Electronic interface system 60 electrically couples electronic controller 20 with printhead dies 40. In one embodiment, electronic interface system 60 includes a plurality of electrical contacts 62 which form input/output (I/O) contacts for electronic interface system 60. As such, electrical contacts 62 provide points for communicating electrical signals between electronic controller 20 and inkjet printhead assembly 12. Examples of electrical contacts 62 include I/O pins which engage corresponding I/O receptacles electrically coupled to electronic controller 20 and I/O contact pads or fingers which mechanically or inductively contact corresponding electrical nodes electrically coupled to electronic controller 20. Although electrical contacts 62 are illustrated as being provided on second face 302 of carrier 30, it is within the scope of the present invention for electrical contacts 62 to be provided on other sides of carrier 30.

Figure 4:
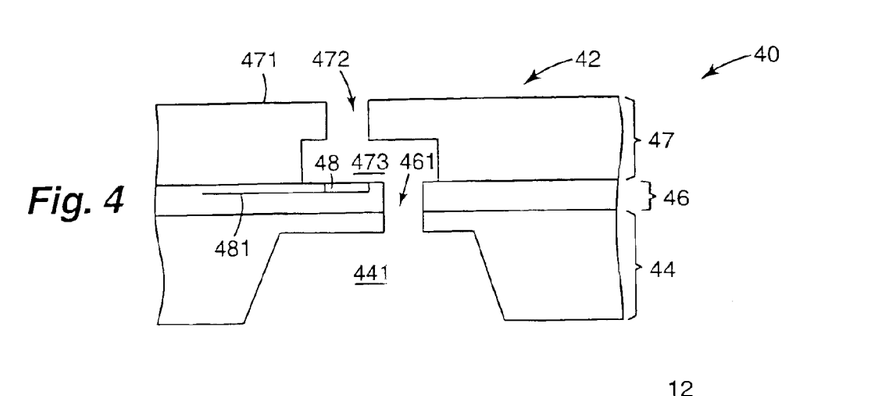
FIG. 4 is a schematic cross-sectional view illustrating portions of one embodiment of a printhead die according to the present invention.

As illustrated in the embodiment of FIGS. 2 and 4, each printhead die 40 includes an array of drop ejecting elements 42. Drop ejecting elements 42 are formed on a substrate 44 which has a fluid (or ink) feed slot 441 formed therein. As such, fluid feed slot 441 provides a supply of fluid (or ink) to drop ejecting elements 42. Substrate 44 is formed, for example, of silicon, glass, or a stable polymer.

In one embodiment, each drop ejecting element 42 includes a thin-film structure 46 with a firing resistor 48 and an orifice layer 47. Thin-film structure 46 has a fluid (or ink) feed channel 461 formed therein which communicates with fluid feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and fluid feed channel 461 of thin-film structure 46. Firing resistor 48 is positioned within nozzle chamber 473 and includes leads 481 which electrically couple firing resistor 48 to a drive signal and ground.

Thin-film structure 46 is formed, for example, by one or more passivation or insulation layers of silicon dioxide, silicon carbide, silicon nitride, tantalum, poly-silicon glass, or other suitable material. In one embodiment, thin-film structure 46 also includes a conductive layer which defines firing resistor 48 and leads 481. The conductive layer is formed, for example, by aluminum, gold, tantalum, tantalum-aluminum, or other metal or metal alloy.

In one embodiment, during operation, fluid flows from fluid feed slot 441 to nozzle chamber 473 via fluid feed channel 461. Nozzle opening 472 is operatively associated with firing resistor 48 such that droplets of fluid are ejected from nozzle chamber 473 through nozzle opening 472 (e.g., normal to the plane of firing resistor 48) and toward a medium upon energization of firing resistor 48.

Example embodiments of printhead dies 40 include a thermal printhead, as previously described, a piezoelectric printhead, a flex-tensional printhead, or any other type of fluidjet ejection device known in the art. In one embodiment, printhead dies 40 are fully integrated thermal inkjet printheads.

Figure 5:
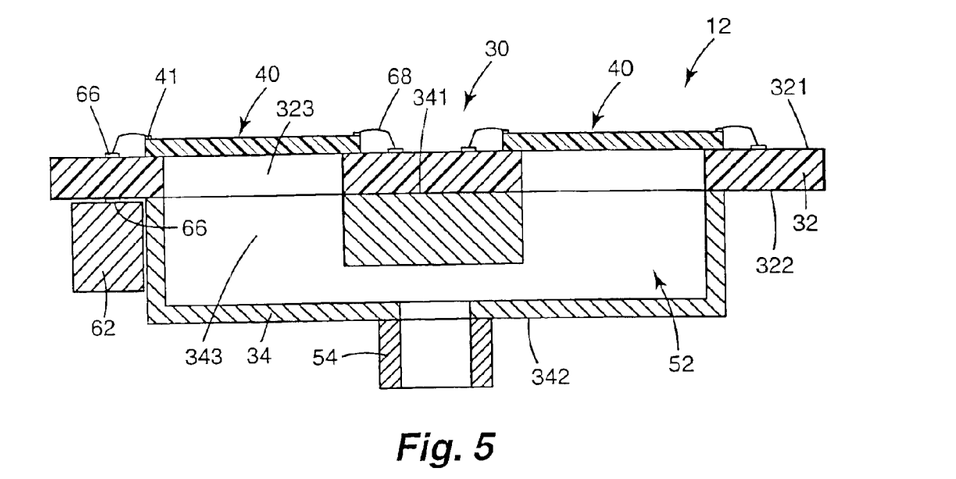
FIG. 5 is a schematic cross-sectional view illustrating one embodiment of an inkjet printhead assembly according to the present invention.

Referring to the embodiment of FIGS. 2, 3, and 5, carrier 30 includes a substrate 32 and a substructure 34. Substrate 32 and substructure 34 both provide and/or accommodate mechanical, electrical, and fluidic functions of inkjet printhead assembly 12. More specifically, substrate 32 provides mechanical support for printhead dies 40, accommodates fluidic communication between ink supply assembly 14 and printhead dies 40 via ink delivery system 50, and provides electrical connection between and among printhead dies 40 and electronic controller 20 via electronic interface system 60. Substructure 34 provides mechanical support for substrate 32, accommodates fluidic communication between ink supply assembly 14 and printhead dies 40 via ink delivery system 50, and accommodates electrical connection between printhead dies 40 and electronic controller 20 via electronic interface system 60.

Substrate 32 has a first side 321 and a second side 322 which is opposite first side 321, and substructure 34 has a first side 341 and a second side 342 which is opposite first side 341. In one embodiment, printhead dies 40 are mounted on first side 321 of substrate 32 and substructure 34 is disposed on second side 322 of substrate 32. As such, first side 341 of substructure 34 contacts and, as described below, is joined to second side 322 of substrate 32.

For transferring ink between ink supply assembly 14 and printhead dies 40, substrate 32 and substructure 34 each have at least one fluid (or ink) passage 323 and 343, respectively, formed therein. Fluid passage 323 extends through substrate 32 and provides a through-channel or through-opening for delivery of ink to printhead dies 40 and, more specifically, fluid feed slot 441 of substrate 44 (FIG. 4). Fluid passage 343 extends through substructure 34 and provides a through-channel or through-opening for delivery of ink to fluid passage 323 of substrate 32. As such, fluid passages 323 and 343 form a portion of ink delivery system 50. Although only one fluid passage 323 is shown for a given printhead die 40, there may be additional fluid passages to the same printhead die, for example, to provide ink of respective differing colors.

In one embodiment, substructure 34 is formed of a non-ceramic material such as plastic. Substructure 34 is formed, for example, of a high performance plastic such as fiber reinforced noryl or polyphenylene sulfide (PPS). It is, however, within the scope of the present invention for substructure 34 to be formed of silicon, stainless steel, or other suitable material or combination of materials. Preferably, substructure 34 is chemically compatible with liquid ink-so as to accommodate fluidic routing.

Figure 6:
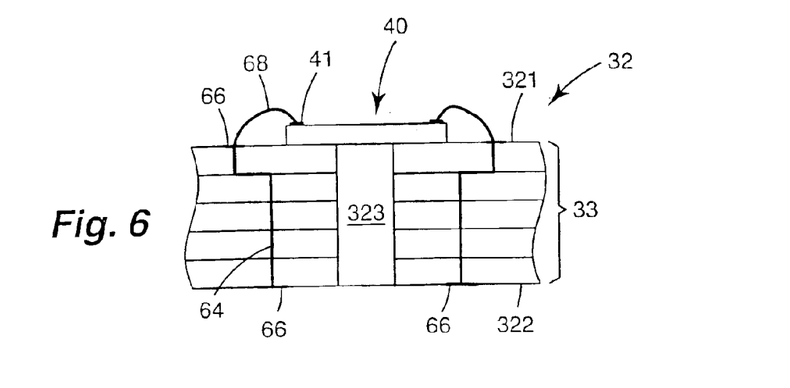
FIG. 6 is a schematic cross-sectional view illustrating one embodiment of a portion of a substrate according to the present invention.

For transferring electrical signals between electronic controller 20 and printhead dies 40, electronic interface system 60 includes a plurality of conductive paths 64 extending through substrate 32, as illustrated in FIG. 6. More specifically, substrate 32 includes conductive paths 64 which pass through and terminate at exposed surfaces of substrate 32. In one embodiment, conductive paths 64 include electrical contact pads 66 at terminal ends thereof which form, for example, I/O bond pads on substrate 32. Conductive paths 64, therefore, terminate at and provide electrical coupling between electrical contact pads 66.

Electrical contact pads 66 provide points for electrical connection to substrate 32 and, more specifically, conductive paths 64. Electrical connection is established, for example, via electrical connectors or contacts 62, such as I/O pins or spring fingers, wire bonds, electrical nodes, and/or other suitable electrical connectors. In one embodiment, printhead dies 40 include electrical contacts 41 which form I/O bond pads. As such, electronic interface system 60 includes electrical connectors, for example, wire bond leads 68, which electrically couple electrical contact pads 66 with electrical contacts 41 of printhead dies 40.

Conductive paths 64 transfer electrical signals between electronic controller 20 and printhead dies 40. More specifically, conductive paths 64 define transfer paths for power, ground, and data among and/or between printhead dies 40 and electrical controller 20. In one embodiment, data includes print data and non-print data.

In one embodiment, as illustrated in FIG. 6, substrate 32 includes a plurality of layers 33 each formed of a ceramic material. As such, substrate 32 includes circuit patterns which pierce layers 33 to form conductive paths 64. In one fabrication methodology, circuit patterns are formed in layers of unfired tape (referred to as green sheet layers) using a screen printing process. The green sheet layers are made of ceramic particles in a polymer binder. Alumina may be used for the particles, although other oxides or various glass/ceramic blends may be used. Each green sheet layer-receives conductor lines and other metallization patterns as needed to form conductive paths 64. Such lines and patterns are formed with a refractory metal, such as tungsten, by screen printing on the corresponding green sheet layer. Thereafter, the green sheet layers are fired. Thus, conductive and non-conductive or insulative layers are formed in substrate 32. While substrate 32 is illustrated as including layers 33, it is, however, within the scope of the present invention for substrate 32 to be formed of a solid pressed ceramic material. As such, conductive paths are formed, for example, as thin-film metallized layers on the pressed ceramic material.

While conductive paths 64 are illustrated as terminating at first side 321 and second side 322 of substrate 32, it is, however, within the scope of the present invention for conductive paths 64 to terminate at other sides of substrate 32. In addition, one or more conductive paths 64 may branch from and/or lead to one or more other conductive paths 64. Furthermore, one or more conductive paths 64 may begin and/or end within substrate 32. Conductive paths 64 may be formed as described, for example, in U.S. patent application Ser. No. 09/648,565, entitled "Wide-Array Inkjet Printhead Assembly with Internal Electrical Routing System" assigned to the assignee of the present invention.

It is to be understood that FIGS. 5 and 6 are simplified schematic illustrations of one embodiment of carrier 30, including substrate 32 and substructure 34. The illustrative routing of fluid passages 323 and 343 through substrate 32 and substructure 34, respectively, and conductive paths 64 through substrate 32, for example, has been simplified for clarity of the invention. Although various features of carrier 30, such as fluid passages 323 and 343 and conductive paths 64, are schematically illustrated as being straight, it is understood that design constraints could make the actual geometry more complicated for a commercial embodiment of inkjet printhead assembly 12. Fluid passages 323 and 343, for example, may have more complicated geometries to allow multiple colorants of ink to be channeled through carrier 30. In addition, conductive paths 64 may have more complicated routing geometries through substrate 32 to avoid contact with fluid passages 323 and to allow for electrical connector geometries other than the illustrated I/O pins. It is understood that such alternatives are within the scope of the present invention.

Figure 7:
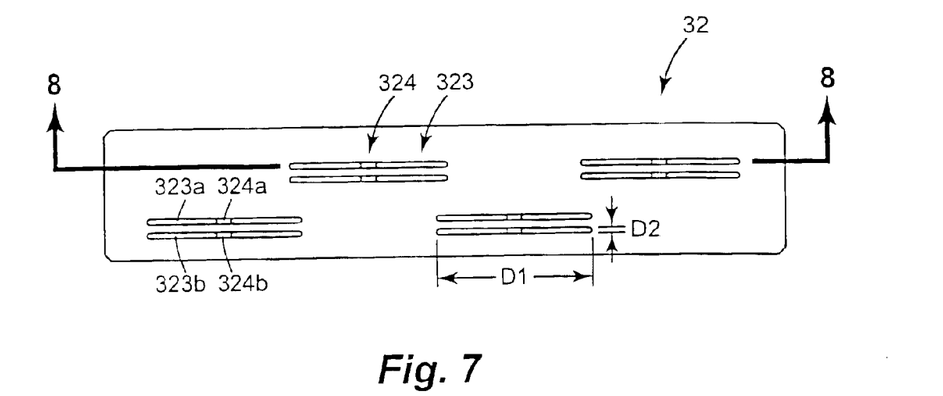
FIG. 7 is a top view illustrating one embodiment of a substrate according to the present invention.
Figure 8:
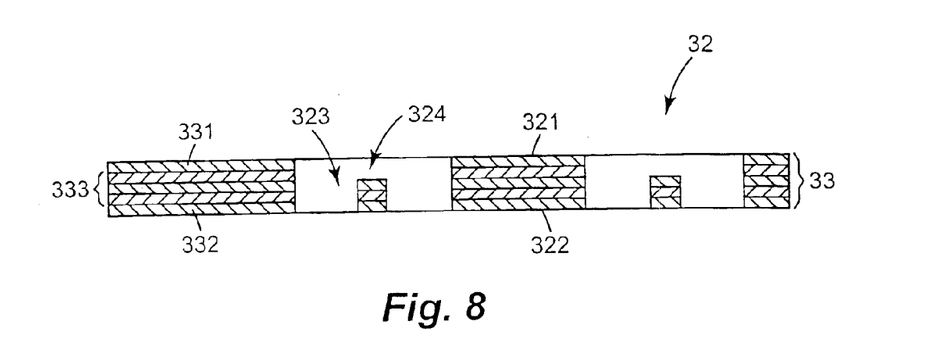
FIG. 8 is a cross-sectional view taken along line 8—8 of FIG. 7.

In one embodiment, as illustrated in FIGS. 7 and 8, fluid passages 323 of substrate 32 include supports 324. Supports 324 extend between opposite sides of fluid passages 323 and constitute cross-ribs of fluid passages 323. As such, supports 324 provide transverse or lateral support for fluid passages 323.

In one embodiment, fluid passages 323 each have a first dimension and a second dimension. The first dimension extends in a first direction D1 and the second dimension extends in a second direction D2 substantially perpendicular to first direction D1. Preferably, the second dimension is less than the first dimension.

In one embodiment, opposite sides of fluid passages 323 are oriented substantially parallel with each other. More specifically, opposite sides of fluid passages 323 extending in first direction D1 are oriented substantially parallel with each other. As such, supports 324 extend in second direction D2 and are oriented substantially perpendicular to opposite sides of fluid passages 323.

In one embodiment, fluid passages 323 each include a pair of fluid passages. More specifically, fluid passages 323 each include a first fluid passage 323a and a second fluid passage 323b. Preferably, first fluid passage 323a and second fluid passage 323b are spaced from and oriented substantially parallel with each other. As such, supports 324 include a first support 324a which extends between opposite sides of first fluid passage 323a and a second support 324b which extends between opposite sides of second fluid passage 323b.

Figure 9:
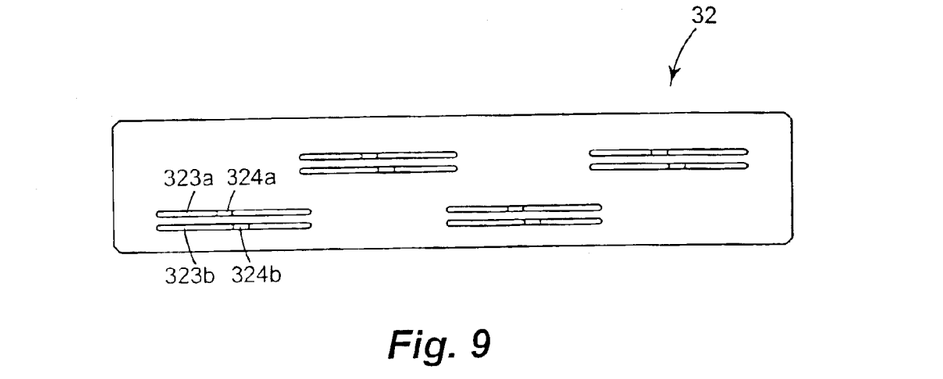
FIG. 9 is a top view illustrating another embodiment of a substrate according to the present invention.

As illustrated in the embodiment of FIG. 7, first support 324a of first fluid passage 323a and second support 324b of second fluid passage 323b are substantially aligned with each other. As such, transverse axes of first support 324a and second support 324b substantially coincide. As illustrated in the embodiment of FIG. 9, first support 324a of first fluid passage 323a and second support 324b of second fluid passage 323b are staggered or offset from each other. As such, a transverse axis of first support 324a is substantially parallel with and offset from a transverse axis of second support 324b. In addition, while each fluid passage 323 is illustrated as including one support 324, it is understood that one or more supports 324 may be provided in each fluid passage 323. As such, supports 324 may be substantially aligned and/or staggered from each other.

Figure 10:
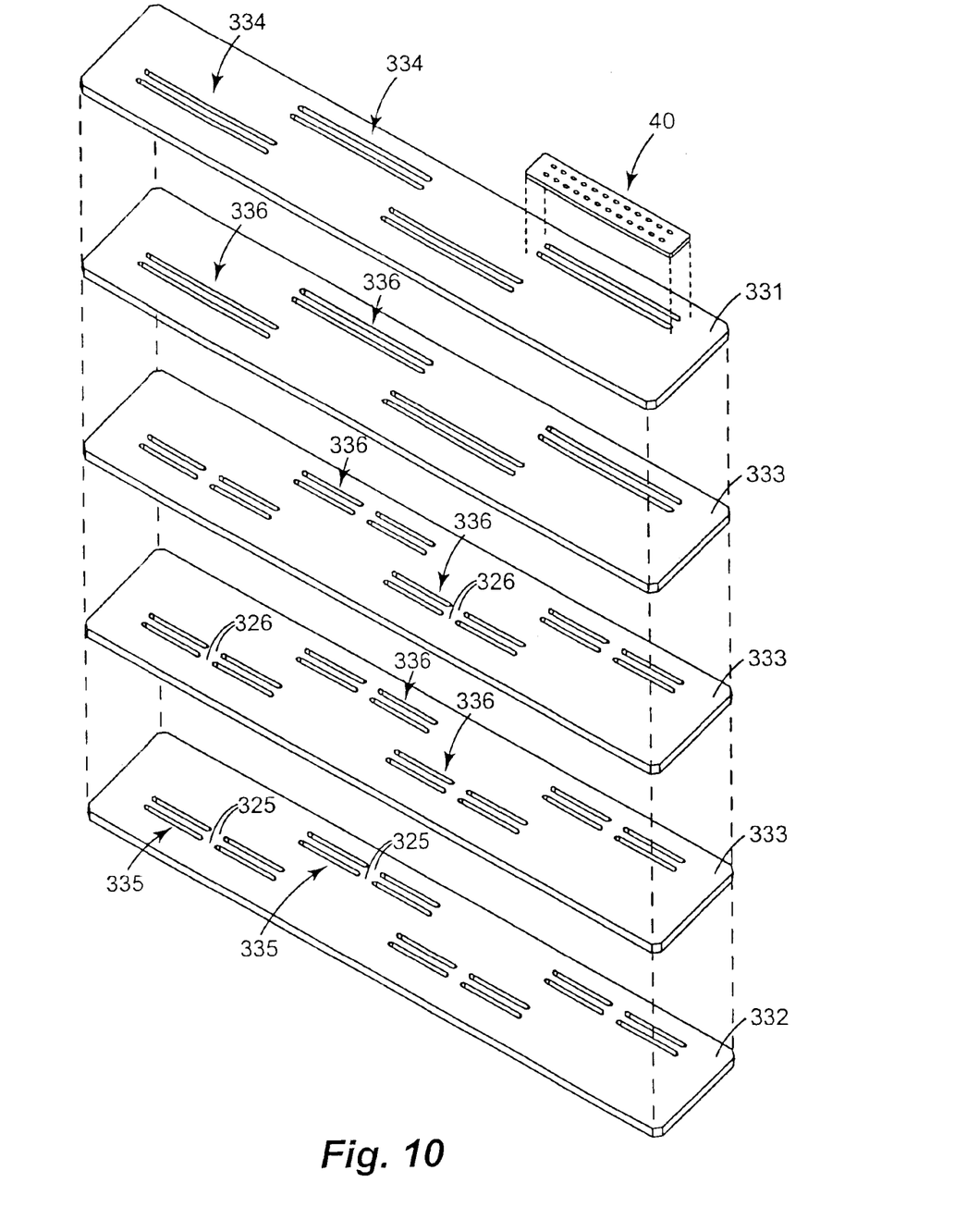
FIG. 10 is an exploded top perspective view illustrating one embodiment of a substrate according to the present invention.

In one embodiment, as illustrated in FIGS. 8 and 10, layers 33 of substrate 32 include a first layer 331, a second layer 332, and one or more intermediary or third layers 333. First layer 331 defines first side 321 of substrate 32 and second layer 332 defines second side 322 of substrate 32. As such, intermediary or third layers 333 are interposed between first layer 331 and second layer 332. Thus, printhead dies 40 are mounted on first layer 331.

First layer 331, second layer 332, and third layers 333 have a plurality of first fluid passages 334, second fluid passages 335, and third fluid passages 336, respectively, formed therein. As such, with one or more third layers 333 interposed between first layer 331 and second layer 332, third fluid passages 336 of third layers 333 communicate with first fluid passages 334 of first layer 331 and second fluid passages 335 of second layer 332. Thus, fluid is communicated between second side 332 of substrate 32 and first side 321 of substrate 32 via second fluid passages 335, third fluid passages 336, and first fluid passages 334.

In one embodiment, supports 324 are formed by portions 325 of second layer 332 and portions 326 of one or more intermediary or third layers 333. More specifically, supports 324 are formed by portions 325 extending between opposite sides of second fluid passages 335 of second layer 332 and portions 326 extending between opposite sides of third fluid passages 336 of one or more intermediary or third layers 333. Thus, portions 325 of second layer 332 and portions 326 of third layers 333 form supports for second fluid passages 335 and third fluid passages 336, respectively.

In one embodiment, supports 324 are confined to second layer 332 and one or more intermediary or third layers 333. As such, supports 324 are excluded from first layer 331 and, in one embodiment, one or more intermediary or third layers 333. Thus, supports 324 extend from second side 322 of substrate 32 toward first side 321 of substrate 32. While supports 324 are illustrated as being provided in second fluid passages 335 formed in second layer 332 and third fluid passages 336 formed in multiple adjacent third layers 333, it is within the scope of the present invention for supports 324 to be provided in fluid passages 323 formed in any number and/or combination of layers 33 of substrate 32, including first layer 331, second layer 332, and/or one or more third layers 333. For example, supports 324 may be formed in all layers 33 of substrate 32 including first layer 331, second layer 332, and third layers 333.

By providing supports 324 in fluid passages 323, integrity and/or strength or substrate 32 is enhanced. As such, multiple fluid passages 323 may be spaced closer together, thus resulting in a more compact arrangement. In addition, supports 324 provide separators for fluid passages 323 and divide fluid passages 323 into multiple sub-passages which may be used, for example, to deliver inks of differing colors to printhead dies 40.

While the above description refers to the inclusion of substrate 32 having fluid passages 323 formed therethrough in an inkjet printhead assembly, it is understood that substrate 32 having fluid passages 323 formed therethrough may be incorporated into other fluid ejection systems including non-printing applications or systems as well as other applications having fluidic channels through a substrate, such as medical devices and other MEMS devices. Accordingly, the present invention is not limited to printheads, but is applicable to any slotted substrates.

In addition, while the above description refers to routing fluid or ink through fluid passages 323 of substrate 32, it is understood that any flowable material, including a liquid such as water or ink, or other chemicals, flowable particles of a solid, such as a powder, or gases may be fed or routed through fluid passages 323 of substrate 32.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of forming a fluid ejection assembly, the method comprising:

providing a substrate including a plurality of layers and having a plurality of fluid passages extending through the plurality of layers, including extending a support through each of the fluid passages between opposite sides of a respective one of the fluid passages; and mounting a plurality of fluid ejection devices on the substrate and communicating each of the fluid ejection devices with at least one of the fluid passages, each of the fluid ejection devices including an array of drop ejecting elements.

2. The method of claim 1, wherein providing the substrate includes interposing at least one third layer of the plurality of layers between a first layer and a second layer of the plurality of layers, wherein mounting the fluid ejection devices includes mounting the fluid ejection devices on the first layer, and wherein extending the support through each of the fluid passages includes forming the support with a portion of at least one of the second layer and the at least one third layer.

3. The method of claim 2, wherein extending the support through each of the fluid passages includes confining the support to the at least one of the second layer and the at least one third layer.

4. The method of claim 1, wherein each of the fluid passages has a first dimension extending in a first direction and a second dimension less than the first dimension extending in a second direction substantially perpendicular to the first direction, wherein extending the support through each of the fluid passages includes extending the support in the second direction.

5. The method of claim 1, wherein the opposite sides of each of the fluid passages are oriented substantially parallel with each other, and wherein extending the support through each of the fluid passages includes orienting the support substantially perpendicular to the opposite sides thereof.

6. The method of claim 1, wherein each of the fluid passages includes a pair of fluid passages, and wherein extending the support through each of the fluid passages includes extending a first support through a first fluid passage of the pair of fluid passages and extending a second support through a second fluid passage of the pair of fluid passages.

7. The method of claim 6, wherein extending the second support through the second fluid passage of the pair of fluid passages includes aligning the second support with the first support.

8. The method of claim 6, wherein extending the second support through the second fluid passage of the pair of fluid passages includes staggering the second support from the first support.

9. The method of claim 1, wherein each of the drop ejecting elements include a chamber, a resistor formed in the chamber, and a nozzle associated with the chamber.

10. The method of claim 1, wherein each of the fluid ejection devices include a device substrate supported by the plurality of layers of the substrate and an orifice layer having a plurality of openings defined therein supported by the device substrate.

11. The method of claim 1, wherein the fluid passages have a height and wherein extending the support through each of the fluid passages includes confining the support to a height that is less than the height of the fluid passages.

12. A method of forming a fluid ejection assembly, the method comprising:

fabricating a substrate including a plurality of layers and having a plurality of fluid passages extending through the plurality of layers;

extending at least one support through each of the fluid passages between opposing walls of a respective one of the fluid passages; and mounting at least one fluid ejection device on the substrate and communicating the at least one fluid ejection device with at least one of the fluid passages, the at least one fluid ejection device including a plurality of chambers each communicating with the at least one of the fluid passages.

13. The method of claim 12, wherein the at least one fluid ejection device further includes a plurality of resistors each formed in a respective one of the chambers.

14. The method of claim 12, wherein fabricating the substrate includes interposing at least one layer of the plurality of layers between two opposing layers of the plurality of layers, and wherein extending the at least one support includes forming the support with a portion of at least one of the at least one layer and one of the two opposing layers.

15. The method of claim 12, wherein fabricating the substrate includes interposing at least one layer of the plurality of layers between two opposing layers of the plurality of layers, and wherein extending the at least one support includes confining the support to the at least one layer and one of the two opposing layers.

16. The method of claim 12, wherein each of the fluid passages has a first dimension extending in a first direction and a second dimension less than the first dimension extending in a second direction substantially perpendicular to the first direction, wherein extending the at least one support includes extending the at least one support in the second direction.

17. The method of claim 12, wherein the opposing walls of each of the fluid passages are oriented substantially parallel with each other, and wherein extending the at least one support includes orienting the at least one support substantially perpendicular to the opposing walls.

18. The method of claim 12, wherein each of the fluid passages includes a pair of fluid passages, and wherein extending the at least one support includes extending a first support between the opposing walls of a first fluid passage of the pair of fluid passages and extending a second support between opposing walls of a second fluid passage of the pair of fluid passages.

19. The method of claim 18, wherein extending the second support includes aligning the second support with the first support.

20. The method of claim 18, wherein extending the second support includes staggering the second support from the first support.

21. The method of claim 12, wherein the fluid passages have a height and wherein extending the at least one support includes confining the support to a height that is less than the height of the fluid passages.

* * * * *